(12) United States Patent
Hsieh

(10) Patent No.: US 8,344,778 B2
(45) Date of Patent: Jan. 1, 2013

(54) CONTROL CIRCUIT FOR CONTROLLING ROTATION SPEED OF A FAN

(75) Inventor: Ming-Chih Hsieh, Tu-Cheng (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 172 days.

(21) Appl. No.: 12/963,648

(22) Filed: Dec. 9, 2010

(65) Prior Publication Data

US 2012/0081173 A1  Apr. 5, 2012

(30) Foreign Application Priority Data

Sep. 30, 2010  (TW) ............................... 99133441 A

(51) Int. Cl.
*H03K 3/017* (2006.01)

(52) U.S. Cl. .......................... 327/175; 327/544; 327/548

(58) Field of Classification Search .................. 327/544, 327/175, 108, 548
See application file for complete search history.

(56) References Cited

U.S. PATENT DOCUMENTS

| 4,417,688 | A | * | 11/1983 | Schnaibel et al. | 236/91 F |
|---|---|---|---|---|---|
| 4,555,910 | A | * | 12/1985 | Sturges | 62/184 |
| 5,457,766 | A | * | 10/1995 | Ko | 388/831 |
| 5,632,917 | A | * | 5/1997 | Cummins et al. | 219/497 |
| 6,967,453 | B2 | * | 11/2005 | Miettinen | 318/471 |
| 7,148,643 | B2 | * | 12/2006 | Yoshitomi et al. | 318/471 |
| 7,796,867 | B2 | * | 9/2010 | Miyajima et al. | 388/811 |
| 8,183,940 | B2 | * | 5/2012 | Koyama et al. | 331/69 |

* cited by examiner

*Primary Examiner* — Kenneth B. Wells
(74) *Attorney, Agent, or Firm* — Altis Law Group, Inc.

(57) ABSTRACT

A control circuit includes a triangular wave generating circuit, a temperature sensing circuit, a first comparator, and a switching circuit. The triangular wave generating circuit outputs a triangular wave signal. The temperature sensing circuit senses a temperature surrounding a fan and outputs a temperature signal. A non-inverting terminal of the first comparator is connected to the triangular wave generating circuit. An inverting terminal of the first comparator is connected to the temperature sensing circuit. The first comparator compares the triangular wave signal with the temperature signal to output a control signal. The switching circuit is connected between a power supply and the fan. The switching circuit turns on or off according to the control signal.

5 Claims, 5 Drawing Sheets

CONTROL CIRCUIT FOR CONTROLLING ROTATION SPEED OF A FAN

BACKGROUND

1. Technical Field

The present disclosure relates to a control circuit for fans.

2. Description of Related Art

In a conventional computer system, fans are controlled by pulse width modulation (PWM) signals from a central processing unit (CPU) according to the temperature of an enclosure, thereby increasing the load of the CPU.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
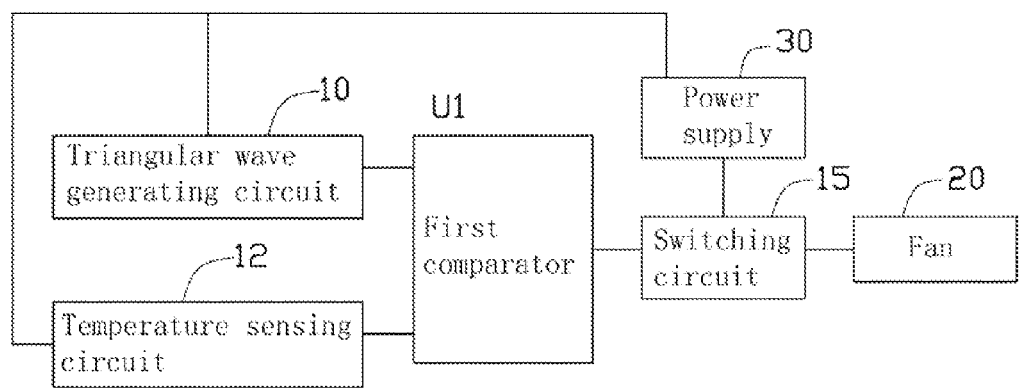
FIG. 1 is a block diagram of an exemplary embodiment of a control circuit for a fan.

Referring to FIG. 1, an exemplary embodiment of a control circuit for controlling a fan 20 includes a triangular wave generating circuit 10, a temperature sensing circuit 12, a first comparator U1, a switching circuit 15, and a power supply 30.

The triangular wave generating circuit 10 is connected to a non-inverting terminal of the first comparator U1, to output a triangular wave signal to the first comparator U1. The temperature sensing circuit 12 is connected to an inverting terminal of the first comparator U1. The temperature sensing circuit 12 senses a temperature and outputs a corresponding temperature signal to the first comparator U1. The first comparator U1 compares the triangular wave signal with the temperature signal, and outputs a control signal to the switching circuit 15 according to the comparison result.

The switching circuit 15 is connected between the power supply 30 and a fan 20, and also connected to the first comparator U1. The switching circuit 15 connects or disconnects the power supply 30 and the fan 20 according to the control signal.

Figure 2:
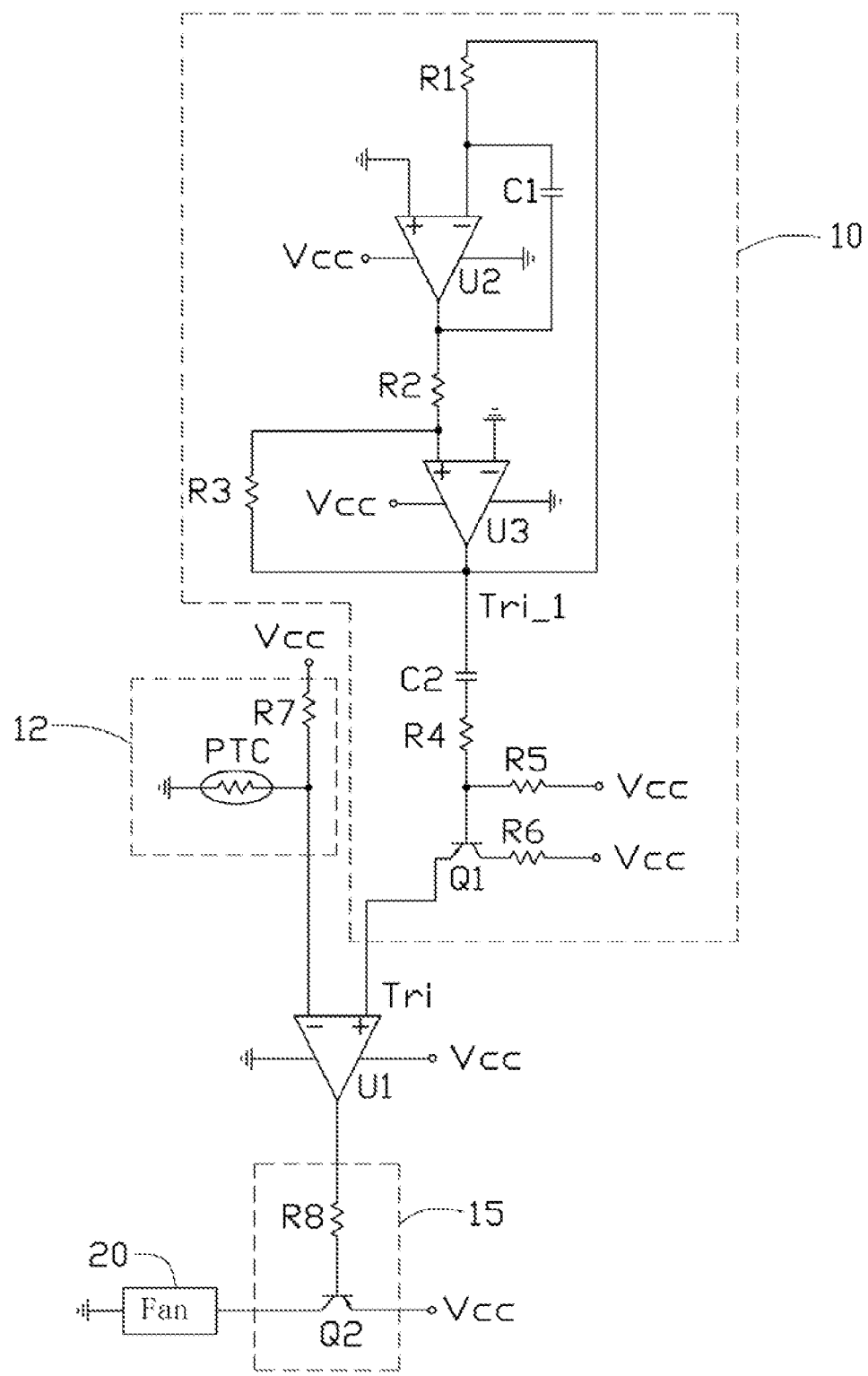
FIG. 2 is a circuit diagram of a first embodiment of the control circuit of FIG. 1, the control circuit includes a triangular wave generating circuit and a comparator.

Referring to FIG. 2, in a first embodiment of the control circuit, the triangular wave generating circuit 10 includes a second comparator U2 and a third comparator U3. A non-inverting terminal of the second comparator U2 is grounded. An inverting terminal of the second comparator U2 is connected to an output terminal of the second comparator U2 through a capacitor C1. The inverting terminal of the second comparator U2 is further connected to an output terminal of the third comparator U3 through a resistor R1. A power terminal of the second comparator U2 is connected to the power supply 30 (Vcc). A ground terminal of the second comparator U2 is grounded. The output terminal of the second comparator U2 is connected to a non-inverting terminal of the third comparator U3 through a resistor R2. The non-inverting terminal of the third comparator U3 is further connected to the output terminal of the third comparator U3 through a resistor R3. An inverting terminal of the third comparator U3 is grounded. A power terminal of the third comparator U3 is connected to the power supply Vcc. A ground terminal of the third comparator U3 is grounded. The output terminal of the third comparator U3 is further connected to a base of a transistor Q1 through a capacitor C2 and a resistor R4 connected in series. The base of the transistor Q1 is further connected to the power supply Vcc through a resistor R5. An emitter of the transistor Q1 is connected to the non-inverting terminal of the first comparator U1. A collector of the transistor Q1 is connected to the power supply Vcc through a resistor R6.

The temperature sensing circuit 12 includes a resistor R7 and a positive temperature coefficient (PTC) thermistor. The inverting terminal of the first comparator U1 is connected to the power supply Vcc through the resistor R7. A first terminal of the PTC thermistor is grounded. A second terminal of the PTC thermistor is connected to a node between the inverting terminal of the first comparator U1 and the resistor R7. A ground terminal of the first comparator U1 is grounded. A power terminal of the first comparator U1 is connected to the power supply Vcc.

The switching circuit 15 includes a pnp transistor Q2 and a resistor R8. An emitter of the transistor Q2 is connected to the power supply Vcc. A base of the transistor Q2 is connected to the output terminal of the first comparator U1 through the resistor R8. The collector of the transistor Q2 is connected to a first terminal of the fan 20. A second terminal of the fan 20 is grounded.

Figure 3:
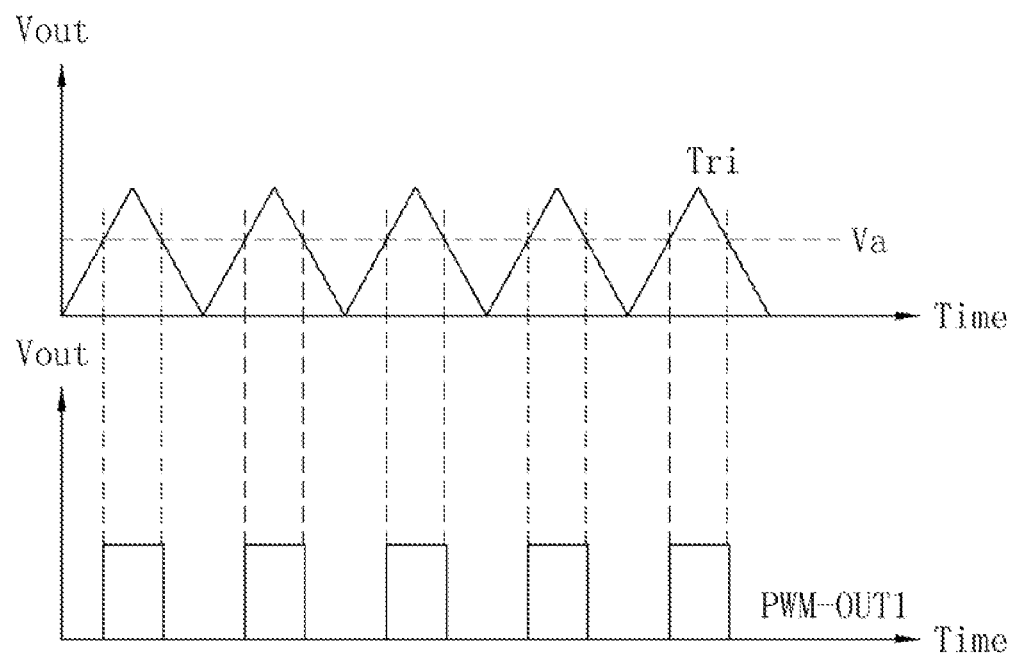
FIG. 3 is a first schematic diagram of a triangular wave generated by the triangular wave generating circuit and a control signal output from the comparator of FIG. 2.
Figure 4:
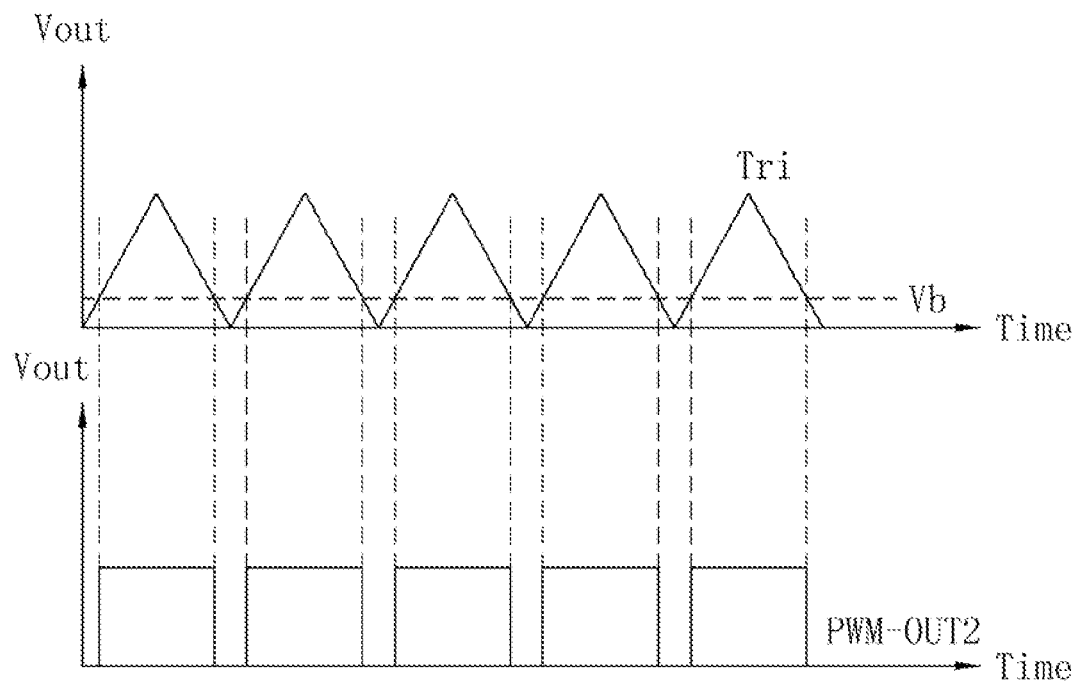
FIG. 4 is a second schematic diagram of a triangular wave generated by the triangular wave generating circuit and a control signal output from the comparator of FIG. 2.

Referring to FIGS. 3 and 4, the triangular wave generating circuit 10 generates a first triangular wave signal Tri_1. The first triangular wave signal Tri_1 is processed by the transistor Q1 to obtain a second triangular wave signal Tri. The second triangular wave signal Tri is transmitted to the first comparator U1. In the embodiment, the transistor Q1 is used to buffer the first triangular wave signal Tri_1. The voltage of the first triangular wave signal Tri_1 and the voltage of the second triangular wave signal Tri meet an equation as follow:
Tri=Tri_1−Vbe, wherein Tri_1 stands for a voltage of the first triangular wave signal Tri_1, Tri stands for a voltage of the second triangular wave signal Tri, Vbe stands for a voltage difference between a voltage of the base and the emitter of the transistor Q1.

As described above, the transistor Q1 can be omitted. As a result, the output terminal of the comparator U3 is connected to the non-inverting terminal of the comparator U1 through the capacitor C2 and the resistor R4 in series. The triangular wave generating circuit 10 outputs the first triangular wave signal Tri_1 to the comparator U1.

When the temperature inside an enclosure housing the fan 20 and the PTC thermistor goes up, the resistance of the PTC thermistor increases according to the characteristic of the positive temperative coefficient thermistor. As a result, a voltage Va (as shown in FIG. 3) at the inverting terminal of the first comparator U1 increases.

According to a characteristic of the comparator, when the voltage at the non-inverting terminal is higher than the voltage at the inverting terminal of the first comparator U1, the first comparator U1 outputs a high level signal. When the voltage at the non-inverting terminal is lower than the voltage at the inverting terminal of the first comparator U1, the first comparator U1 outputs a low level signal. As a result, the first comparator U1 outputs a first control signal PWM-OUT1 as shown in FIG. 3. The first control signal PWM-OUT1 has a first duty cycle.

When the temperature inside the enclosure housing the fan 20 and the PTC thermistor goes down, the resistance of the PTC thermistor reduces according to the characteristic of the positive temperative coefficient thermistor. As a result, a voltage Vb (as shown in FIG. 4) at the inverting terminal of the first comparator U1 reduces. As a result, the first comparator U1 outputs a second control signal PWM-OUT2 as shown in FIG. 4. The second control signal PWM-OUT2 has a second duty cycle.

Comparing the first control signal PWM-OUT1 with the second control signal PWM-OUT2, the first duty cycle is lower than the second duty cycle. Moreover, the rotation speed of the fan 20 controlled by a PWM signal with a lower duty cycle is greater than a rotation speed of the fan 20 controlled by a PWM signal with a higher duty cycle. When the temperature inside the enclosure is higher, the rotation speed of the fan 20 is faster.

The control circuit does not use a central processing unit (CPU) in the enclosure to control the fan 20. As a result, the control circuit can reduce the load of the CPU.

Figure 5:
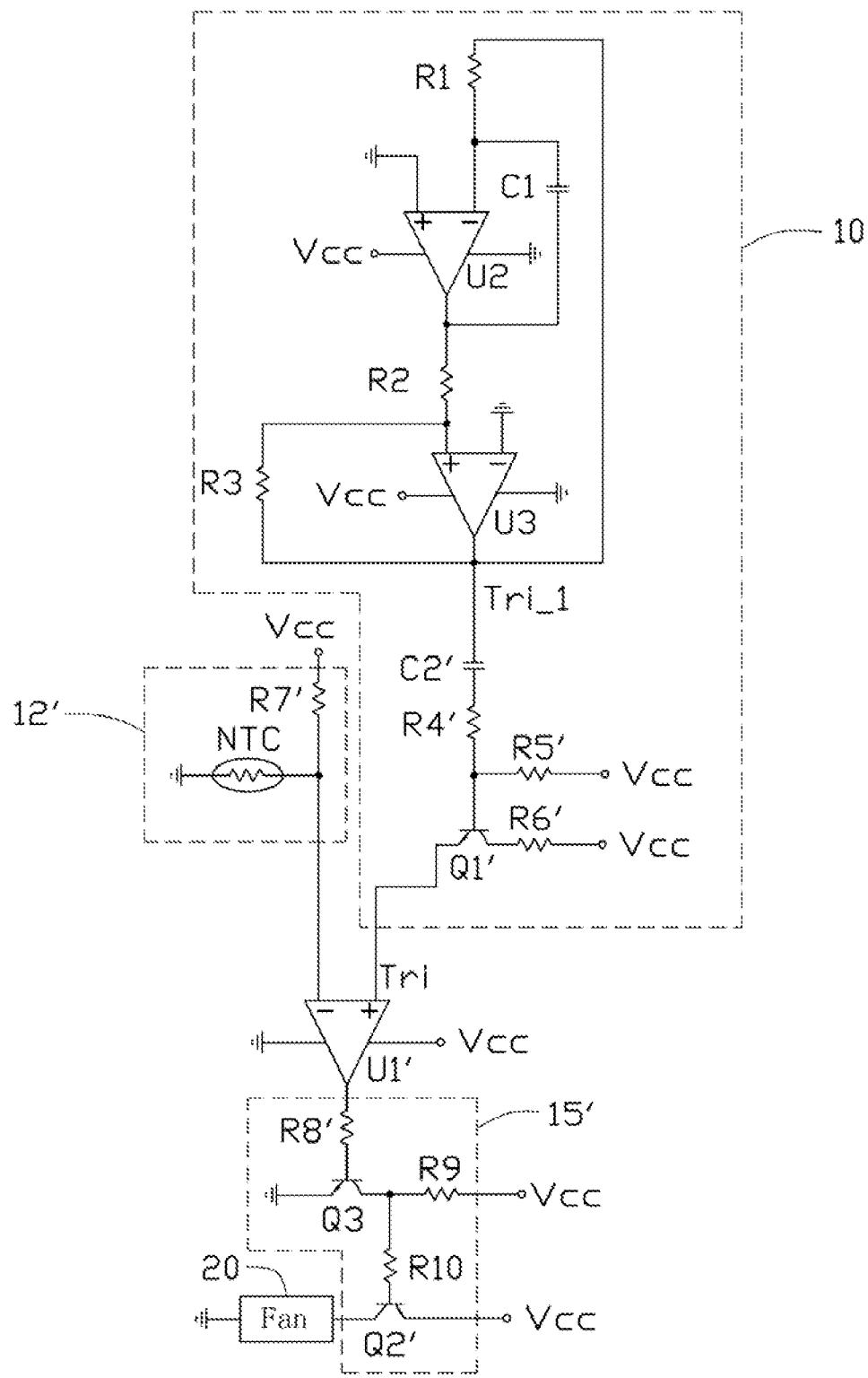
FIG. 5 is a circuit diagram of a second embodiment of the control circuit of FIG. 1.

Referring to FIG. 5, in a second embodiment of the control circuit, the temperature sensing circuit 12' includes a resistor R7' and a negative temperature coefficient (NTC) thermistor. The switching circuit 15' includes a pnp transistor Q2' and an npn transistor Q3. An output terminal of the first comparator U1' is connected to a base of the transistor Q3 through a resistor R8'. An emitter of the transistor Q3 is grounded. A collector of the transistor Q3 is connected to the power supply Vcc through a resistor R9. The collector of the transistor Q3 is further connected to a base of the transistor Q2' through a resistor R10. An emitter of the transistor Q2' is connected to the power supply Vcc. A collector of the transistor Q2' is connected to the first terminal of the fan 20.

Similar to the first embodiment, when the temperature inside the enclosure is different, the first comparator U1' outputs control signals with different duty cycles to control the fan 20.

The foregoing description of the embodiments of the disclosure has been presented only for the purposes of illustration and description and is not intended to be exhaustive or to limit the disclosure to the precise forms disclosed. Many modifications and variations are possible in light of the above disclosure. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skill in the art to which the present disclosure pertains without departing from its spirit and scope. Accordingly, the scope of the present disclosure is defined by the appended claims rather than the foregoing description and the exemplary embodiments described therein.

What is claimed is:

1. A control circuit for controlling a rotation speed of a fan, the control circuit comprising:
a triangular wave generating circuit to output a first triangular wave signal;
a temperature sensing circuit to sense a temperature surrounding the fan and output a temperature signal;
a first comparator, wherein a non-inverting terminal of the first comparator is connected to the triangular wave generating circuit to receive the first triangular wave signal, an inverting terminal of the first comparator is connected to the temperature sensing circuit to receive the temperature signal, the first comparator compares the first triangular wave signal with the temperature signal to output a control signal; and
a switching circuit connected between a power supply and the fan, wherein the switching circuit turns on or off according to the control signal;
wherein the temperature sensing circuit comprises a first resistor and a positive temperature coefficient thermistor, a first terminal of the first resistor is connected to the power supply, a second terminal of the first resistor is connected to the inverting terminal of the first comparator, a first terminal of the positive temperature coefficient thermistor is grounded, and a second terminal of the positive temperature coefficient thermistor is connected to a node between the inverting terminal of the first comparator and the first resistor.

2. The control circuit of claim 1, wherein the switching circuit comprises a pnp transistor and a second resistor, an emitter of the pnp transistor is connected to the power supply, a base of the pnp transistor is connected to an output terminal of the first comparator through the second resistor, and a collector of the pnp transistor is connected to the fan.

3. The control circuit of claim 1, wherein the switching circuit comprises a pnp transistor, an npn transistor, and second to fourth resistors, an output terminal of the first comparator is connected to a base of the npn transistor through the second resistor, an emitter of the npn transistor is grounded, a collector of the npn transistor is connected to the power supply through the third resistor, the collector of the npn transistor is further connected to a base of the pnp transistor through the fourth resistor, an emitter of the pnp transistor is connected to the power supply, and a collector of the pnp transistor is connected to the fan.

4. The control circuit of claim 1, wherein the triangular wave generating circuit comprises a second comparator and a third comparator, a non-inverting terminal of the second comparator is grounded, an inverting terminal of the second comparator is connected to an output terminal of the second comparator through a first capacitor, the inverting terminal of the second comparator is further connected to an output terminal of the third comparator through a first resistor, an output terminal of the second comparator is connected to a non-inverting terminal of the third comparator through a second resistor, the non-inverting terminal of the third comparator is connected to an output terminal of the third comparator through a third resistor, an inverting terminal of the third comparator is grounded, and the output terminal of the third comparator is connected to the non-inverting terminal of the first comparator through a second capacitor and a fourth resistor connected in series to output the first triangular wave signal to the first comparator.

5. The control circuit of claim 4, further comprising an npn transistor, wherein the npn transistor is connected between the fourth resistor and the non-inverting terminal of the first comparator, a base of the npn transistor is connected to the fourth resistor, the base of the npn transistor is further connected to the power supply through a fifth resistor, an emitter of the npn transistor is connected to the non-inverting terminal of the first comparator, and a collector of the npn transistor is connected to the power supply through a sixth resistor.

* * * * *